(12) United States Patent
Jacquet et al.

(10) Patent No.: US 7,202,518 B2
(45) Date of Patent: Apr. 10, 2007

(54) INTEGRATED DYNAMIC RANDOM ACCESS MEMORY ELEMENT, ARRAY AND PROCESS FOR FABRICATING SUCH ELEMENTS

(75) Inventors: Francois Jacquet, Froges (FR);
Philippe Candellier, Saint Mury (FR);
Robin Cerutti, Grenoble (FR);
Philippe Coronel, Beauregard (FR);
Pascale Mazoyer, Domene (FR)

(73) Assignee: STMicroelectronics S.A., Montrouge (FR)

( * ) Notice: Subject to any disclaimer, the term of this patent is extended or adjusted under 35 U.S.C. 154(b) by 384 days.

(21) Appl. No.: 10/877,755

(22) Filed: Jun. 25, 2004

(65) Prior Publication Data
US 2005/0184325 A1    Aug. 25, 2005

(30) Foreign Application Priority Data
Jul. 1, 2003    (FR) .................................. 03 07960

(51) Int. Cl.
*H01L 27/108* (2006.01)
(52) U.S. Cl. .................................. 257/300; 257/E27.09
(58) Field of Classification Search ................ 257/213, 257/288, 296, 298, 299, 300, 302–305, 307, 257/308, E27.09, E21.647, E21.664
See application file for complete search history.

(56) References Cited
U.S. PATENT DOCUMENTS
5,057,888 A    10/1991    Fazan

| | | |
|---|---|---|
| 5,315,143 A | 5/1994 | Tsuji |
| 5,932,904 A * | 8/1999 | Hsu et al. .................... 257/295 |
| 6,424,020 B1 * | 7/2002 | Vu et al. ..................... 257/507 |
| 6,744,087 B2 * | 6/2004 | Misewich et al. .......... 257/295 |
| 2003/0015757 A1 | 1/2003 | Ohsawa |

FOREIGN PATENT DOCUMENTS

| | | |
|---|---|---|
| EP | 1 280 205 | 1/2003 |
| JP | 05243521 | 9/1993 |
| JP | 63102264 | 7/1998 |

OTHER PUBLICATIONS

Patent Abstracts of Japan, vol. 012, No. 342 (E-658), Sep. 14, 1988.
Patent Abstracts of Japan, vol. 017, No. 702 (E1482), Dec. 21, 1993.
French Search Report, FR 0307960, dated May 26, 2004.

* cited by examiner

*Primary Examiner*—Brook Kebede
(74) *Attorney, Agent, or Firm*—Jenkens & Gilchrist, PC

(57) ABSTRACT

An integrated dynamic random access memory element includes two cells for the storage of two respective bits. A source region and a drain region are included. Each cell comprises a field-effect transistor having a gate and an intermediate portion which extend between the source and drain regions. A channel is provided in the intermediate portion of the transistor for each cell. A polarization electrode is placed between the respective intermediate portions of the two transistors. This polarization electrode is capacitively coupled to the intermediate portion of each transistor and is used to store the first and second bits.

32 Claims, 3 Drawing Sheets

INTEGRATED DYNAMIC RANDOM ACCESS MEMORY ELEMENT, ARRAY AND PROCESS FOR FABRICATING SUCH ELEMENTS

PRIORITY CLAIM

The present application claims priority from French Application for Patent No. 03 07960 filed Jul. 1, 2003, the disclosure of which is hereby incorporated by reference.

BACKGROUND OF THE INVENTION

1. Technical Field of the Invention

The present invention relates to an integrated DRAM (Dynamic Random Access Memory) element.

2. Description of Related Art

A DRAM element comprises, in a known manner, a field-effect transistor and an electronic component in which a quantity of electrical charge representative of a bit is stored. The component for storing the quantity of charge may, for example, be a capacitor. The transistor allows the charging of the capacitor with a predetermined quantity of charge to be controlled during a step of writing the bit into the DRAM element. It also is used to control the removal of the quantity of charge stored in the capacitor during a step of reading the bit.

It is known, in particular from document U.S. 2003/0015757, the disclosure of which is incorporated by reference, to use a portion of the transistor of the DRAM element, located on an opposite side of the channel of the transistor from the gate, to store the quantity of charge representative of the bit. This portion of the transistor is denoted hereafter as storage portion. The operation of the DRAM element in read mode or write mode is then substantially the same as for a DRAM element with a capacitor. An additional electrode is provided against the transistor, which additional electrode is capacitively coupled to the storage portion. When this electrode is polarized, a quantity of electrical charge is generated or not in the storage portion of the transistor during the write step, depending on the value of the bit. This quantity of charge remains in the storage portion after an interruption of the polarization of the electrode. During the read step, a value of the threshold voltage of the transistor is detected, which depends on whether or not charges are present in the storage portion.

The processing devices currently required to execute complex applications require large numbers of DRAM elements. These DRAM elements are produced on semiconductor substrates which correspond to an appreciable part of their manufacturing cost. There is consequently a major economic challenge to be able to produce a large number of DRAM elements on the minimum area of substrate.

There accordingly exists a need in the art for a DRAM element that is compact when considering the number of bits that can be stored.

SUMMARY OF THE INVENTION

The invention relates to an integrated dynamic random access memory element comprising first and second cells for the storage of two respective bits. The element also comprises a source region and a drain region which have respective portions of semiconductor material of a same type of electrical conduction. Each cell comprises a field-effect transistor having a gate and an intermediate portion of semiconductor material, and furthermore having a source, a drain and a channel that are located in the source region, the drain region and the intermediate portion, respectively. The two transistors are placed in parallel between the source region and the drain region. The element furthermore includes a polarization electrode placed between the respective intermediate portions of the two transistors. The polarization electrode is electrically isolated from each transistor and is capacitively coupled to the intermediate portion of each transistor.

The DRAM element of the invention therefore makes it possible to store two independent bits, although it includes only a single polarization electrode. Greater compactness is therefore obtained compared with two DRAM cells with electrical charge storage in the transistor, that are independent of each other. This increase results in the elimination of one polarization electrode per pair of cells.

According to the preferred embodiment of the invention, the gate of each transistor of the DRAM element is placed on an opposite side from the intermediate portion of said transistor relative to the polarization electrode. This configuration provides particularly effective capacitive coupling of the polarization electrode to the intermediate portion of each transistor. The operation of the DRAM element during the write step is thus improved.

Furthermore, the intermediate portion of one of the two transistors, the polarization electrode and the intermediate portion of the other transistor may be aligned in a direction of juxtaposition of the two transistors of the DRAM element. This results in a configuration of the element that is even more compact.

When the DRAM element is produced on the surface of a substrate, the direction of juxtaposition may be approximately perpendicular to the surface of the substrate. The DRAM element thus oriented occupies a particularly small portion of the surface of the substrate.

The invention also relates to a memory plane comprising DRAM elements of the above type which are placed in an array arrangement.

Finally, the invention relates to a process for fabricating DRAM elements of the type of the invention. Such a process comprises the following steps:

formation, on one surface of a substrate, of a stack comprising, starting from said surface, a first portion of a temporary material, a first intermediate portion, a second portion of temporary material, a second intermediate portion and a third portion of temporary material, these being placed between a source region and a drain region that are borne by the substrate and consist of a semiconductor material of a same electrical conduction type, the first and second intermediate portions being made of a semiconductor material and placed in contact with the source and drain regions;

removal of the first, second and third portions of temporary material so as to form respective cavities;

formation of a lower gate, of a polarization electrode and of an upper gate in the respective cavities of the first, second and third portions of temporary material, the lower gate, the polarization electrode and the upper gate each being electrically conducting and isolated from the source and drain regions and isolated from the first and second intermediate portions; and production of electrical connections connecting the lower gate, the polarization electrode and the upper gate, respectively.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

In the FIGURES, for the sake of clarity, the dimensions of various parts of components shown have not been drawn to scale. These FIGURES are views of a substantially planar substrate bearing one or more DRAM elements. D0 denotes a direction perpendicular to the surface of the substrate, oriented upwards in the figures. In the rest of the description, the terms "on", "under", "lower" and "upper" are used with reference to this orientation. Moreover, in all of the FIGURES, identical references correspond to identical elements.

Figure 1:
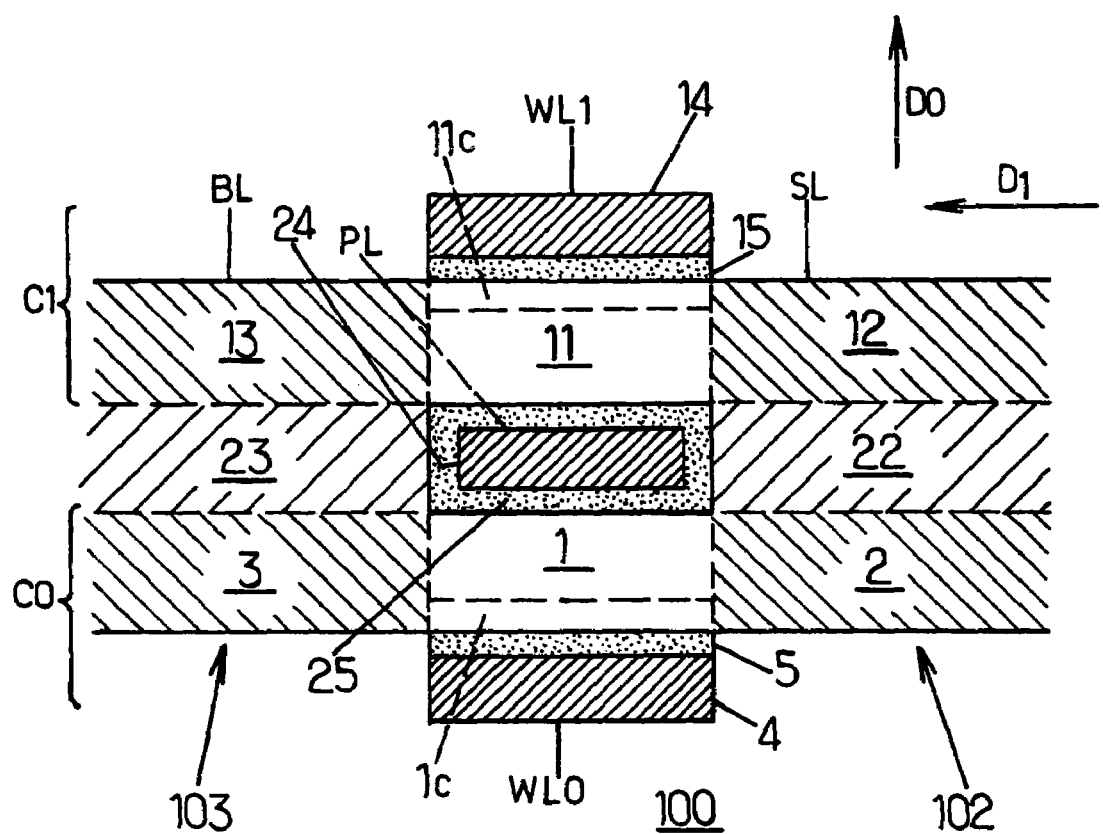
FIG. 1 shows a DRAM element according to the invention.

FIG. 1 shows a DRAM element according to the invention which comprises two MOS (Metal Oxide Semiconductor) or field-effect transistors superposed on top of a surface of a substrate 100 along the direction D0. The lower transistor comprises a source 2, an intermediate portion 1 and a drain 3 that are aligned in a direction D1 parallel to the surface of the substrate. It furthermore includes a gate 4 insulated from the portion 1 by an insulating layer 5. The gate 4 is connected to a word line WL0. A lower part of the portion 1, adjacent to the layer 5, constitutes the channel 1c of the lower transistor. The lower transistor constitutes a binary storage cell C0.

The upper transistor constitutes a binary storage cell C1 and possesses a structure symmetrical with that of the lower transistor. Thus, an intermediate portion 11 is placed between a source 12 and a drain 13, said intermediate portion 11 being aligned with said source and said drain in the direction D1. An upper part of the portion 11 constitutes a channel 11c controlled by a gate 14, which is separated from the portion 11 by an insulating layer 15. The gate 14 is connected to a word line WL1 independent of the line WL0.

The sources 2 and 12 of the two transistors are in electrical contact with a common source portion 22 placed between the sources 2 and 12. They constitute, with the portion 22, a source region 102. The portion 22 may have a lower electrical doping concentration than the doping concentrations of the sources 2 and 12. The region 102 is supplied via a source line SL. Likewise, the drains 3 and 13 of the two transistors are in electrical contact with a common drain portion 23 placed between the drains 3 and 13. The drains 3 and 13 and the portion 23 constitute a drain region 103, which is connected to a bit line BL. The portion 23 may have a lower electrical doping concentration than those of the drains 3 and 13.

The electrical potential of the source line SL is considered hereafter as the electrical potential reference.

A polarization electrode 24 is placed between, on the one hand, the portions 1 and 11 in the direction D0 and between, on the other hand, the portions 22 and 23 in the direction D1. The electrode 24 is surrounded by a sheath 25 of insulating material, which separates it from the portions 1, 11, 22 and 23. It is also electrically connected to a polarization line PL indicated by dotted lines in the FIG. 1.

Two independent bit values are written into the cells C0 and C1 by applying a positive voltage, for example 5 volts, between the bit line BL and the source line SL. At the same time, the electrode 24 is taken to a defined non-zero electrical potential, for example positive potential, transmitted by the polarization line PL.

A first electrical potential, either negative or zero, or strictly positive, is then applied to the word line WL0 and an independent second electrical potential, likewise either negative or zero, or strictly positive, is then applied to the word line WL1. If either the first or the second applied electrical potential is positive, the corresponding transistor then conducts an electrical current sufficient to ionize the material of the intermediate portion 1 or 11 of this transistor. This ionization creates an electrical charge attracted by the polarization electrode 24 because of the capacitive coupling between the electrode 24 and the portions 1 and 11. This charge remains within the portion 1 or 11 in which it has been created if the circuit between the lines SL and BL is open before the polarization of the electrode 24 is interrupted. If either the first or the second applied electrical potential is negative or zero, the corresponding transistor is non-conducting, no ionization is caused and no charge is created in the corresponding portion 1 or 11. Thus, depending on the electrical potentials transmitted by the lines WL0 and WL1, two independent bits may be recorded separately in the cells C0 and C1, respectively.

The two bit values thus recorded may be read separately by applying a positive voltage, for example 5 volts, between the bit line BL and the source line SL, and a voltage of 2.5 volts for example to the line WL0 or WL1 which corresponds to the read bit. For a defined electrical potential transmitted by the line WL0 or WL1, the electrical current conducted by each transistor depends on the electrical charge stored in the corresponding intermediate volume 1, 11. Detection of this current allows the recorded bit value to be read.

A process for fabricating a circuit comprising a DRAM element as described above will now be described. The elementary steps of the process for fabricating an integrated electronic circuit, that are well known to those skilled in the art, will not be described. Only a succession of elementary steps for producing such a DRAM element will be shown.

Figure 2:
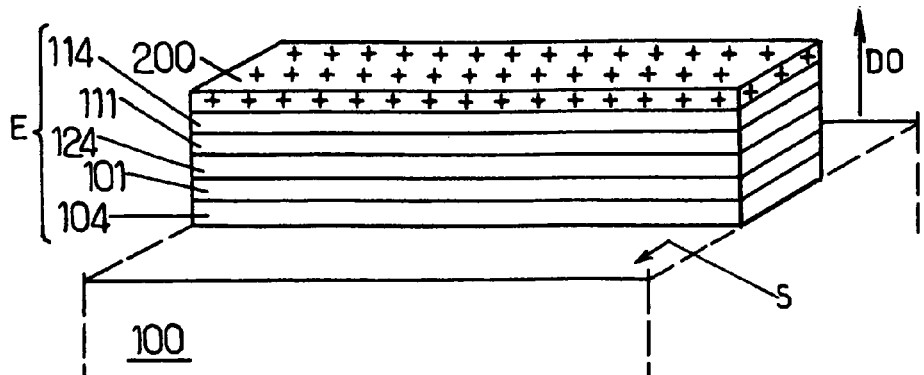
FIGS. 2–4 are perspective views of an integrated electronic circuit illustrating three steps of a process for fabricating a DRAM element according to FIG. 1.

FIG. 2 shows a substrate 100, for example made of crystalline silicon, having a planar upper surface S. The substrate 100 was initially surface-treated so as to be electrically insulating for contact via this surface. Such a treatment may, for example, be a surface oxidation of the substrate 100 in such a way that the substrate 100 remains crystalline right up to its surface S.

The process then continues with the successive formation, on the substrate 100, of a first layer 104 of a temporary material, a first silicon layer 101, a second layer 124 of temporary material, a second silicon layer 111, a third layer 114 of temporary material and then a layer 200 of a protective material. The protective material may, for example, be silicon nitride. The temporary material is, for example, a silicon-germanium alloy. In a known manner, the layers 104, 101, 124, 111 and 114 may each be grown epitaxially from the surface S of the substrate in the case of the layer 104 and then from the upper surface of the last layer formed in the case of the following layers.

Next, a central part of the layer 200 is covered with a lithographically formed mask (not shown) and then the layers 200, 114, 111, 124, 101 and 104 outside the mask are etched in succession. The configuration of the circuit shown in FIG. 2 is then obtained, which comprises a stack E of superposed portions on top of the substrate 100, in the direction D0, corresponding to the layers 104, 101, 124, 111, 114 and 200, respectively.

Two regions 102 and 103 on two opposed sides of the above stack are then formed on the surface S in the direction D1. The regions 102 and 103 are formed up to a height above the level of the portion 200, in the direction D0. The regions 102 and 103 are made of silicon and grown epitaxially from the surface S. They therefore form continuations of the portions 101 and 111 in the direction D1.

The upper surface of the circuit is then polished in the direction D0, towards the substrate 100. Since the material of the protective layer 200 is harder than the silicon of the regions 102 and 103, the upper surfaces of the regions 102 and 103 are brought to a level slightly below, in the direction D0, that of the upper surface of the portion 200.

In a known manner, the portions 101 and 111, and also the regions 102 and 103, may be doped by implantation during or after they have been respectively formed on the circuit. A defined type of electrical conduction is thus obtained for each of these portions or regions. For example, the portions 101 and 111 are doped in order to obtain p-type conduction and regions 102 and 103 are doped in order to obtain n-type conduction. Preferably, the doping concentrations of the regions 102 and 103 are varied along the direction D0: they are higher at levels of these regions that correspond to the heights in the direction D0 of the portions 101 and 111.

Figure 3:
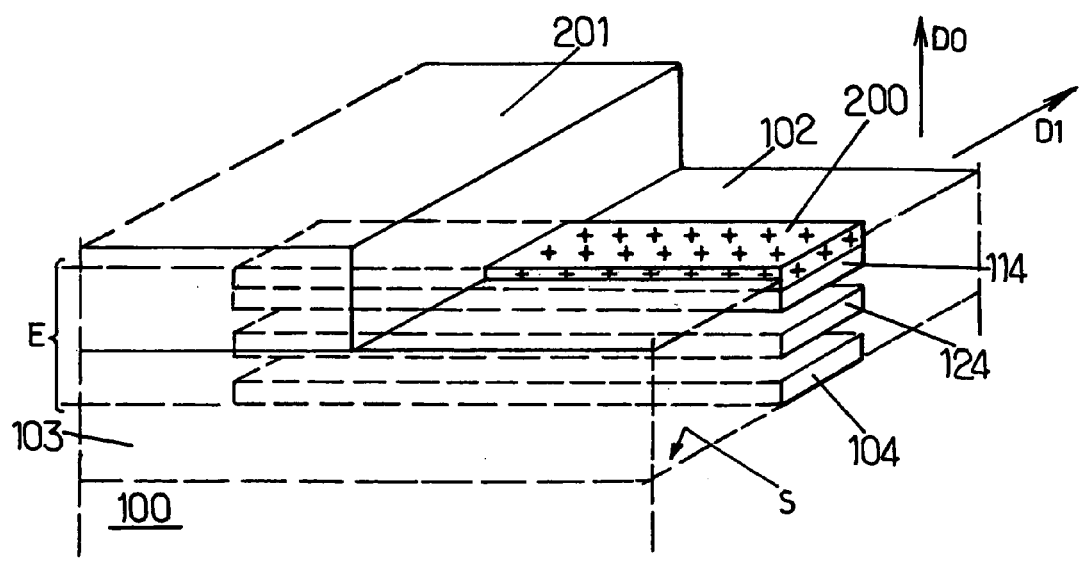

Next, a thick mask 201, for example a silica mask, is then formed on part of the circuit (FIG. 3). The mask 201 covers part of the stack E and parts of the regions 102 and 103 that are adjacent to the covered part of the stack.

The respective parts of the regions 102 and 103 that are not covered by the mask 201 are removed by anisotropic etching. The lateral sides of the portions 104, 101, 124, 111 and 114 are thus exposed in that part of the stack E which is not covered by the mask 201.

Boron is then implanted into the circuit, up to a level below that of the surface S in the direction D0. Thanks to the thick mask 201, this implantation is limited to that part of the circuit which is not covered by the mask 201.

The first portion 104, the second portion 124 and the third portion 114 of temporary material are selectively removed, via the exposed lateral sides of the portions of the stack E, so as to form respective cavities. This removal may be carried out by selective isotropic dry etching of the silicon-germanium alloy. Such an etching step removes the material containing germanium without impairing the materials of the portion 101 and 111, nor the materials of the residual parts of the regions 102 and 103, nor the material of the substrate 100, which materials contain no germanium. The portions 104, 124 and 114 are entirely removed, including in that part of the stack E which is covered by the mask 201.

The mask 201 is removed.

The surfaces of the portions 101 and 111 and of the regions 102 and 103 that are exposed by the cavities then undergo surface oxidation. Such oxidation is carried out, for example, by bringing an oxidizing gas into contact with the circuit and by heating the circuit so as to control the oxide thickness thus formed.

Figure 4:
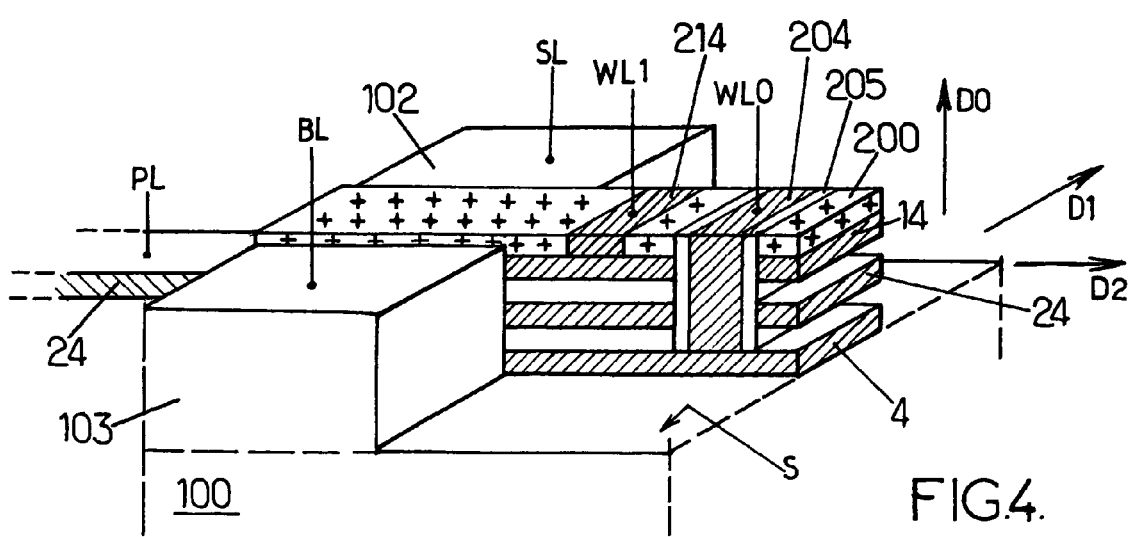

Next, a metallic material is deposited in the cavities formed instead of the portions 104, 124 and 114. The metallic material may, for example, be titanium nitride (TiN), tantalum nitride (TaN), tungsten (W) or copper (Cu) and may be obtained, for example, by chemical vapor deposition (CVD). Excess amounts of metallic material deposited outside the cavities are removed by isotropic etching, as dry etching or wet etching. Thus, a lower gate 4 is formed in the cavity corresponding to the portion 104, a polarization electrode 24 is formed in the cavity corresponding to the portion 124 and an upper gate 14 is formed in the cavity corresponding to the portion 114 (FIG. 4). Thanks to the prior oxidation of the surfaces exposed by the cavities, the gates 4 and 14 and the electrode 24 are electrically insulated from the portions 101 and 111 and also from the regions 102 and 103, while still being capacitively coupled to the portions 101 and 111.

Electrical connections 204 and 214 connecting the gates 4 and 14 respectively are then produced, by combining the processes of masking, anisotropic etching and deposition of metallic material. An insulating sheath 205 may optionally be placed around the connection 204, if the connection 204 has a configuration in which it passes through the gate 14.

Finally, the boron-implanted silicon material belonging to the portions 101 and 111 may be selectively removed by wet etching, using a mixture of hydrofluoric acid (HF), nitric acid ($HNO_3$) and acetic acid ($CH_3COOH$). Such a removal makes it possible to limit the channels of the two transistors to those parts of the portions 101 and 111 which lie between the regions 102 and 103, in that part of the circuit corresponding to the mask 201. An electrically insulating filler material may be deposited instead of those parts of the portions 101 and 111 thus removed.

In the circuit thus produced, the regions 102 and 103 correspond to the source region and to the drain region respectively, these being described in relation to FIG. 1. In the region 102, the source 2, the source portion 22 and the source 12 correspond to the various levels in the direction D0 that are associated with different electrical doping concentrations. Likewise, the various levels created in the region 103 in the direction D0 and associated with different doping concentrations correspond to the drain 3, to the drain portion 23 and to the drain 13, respectively. The insulating sheath 25 in FIG. 1 is formed during the surface oxidation of the surfaces of the portions 101 and 111 and of the regions 102 and 103 that are momentarily exposed by the formation of the cavities.

Connections may be produced, in a known manner, on the regions 102 and 103, via lines SL and BL respectively. Likewise, the connections 204 and 214 may be extended by the respective lines WL0 and WL1. Moreover, the electrode 24 may be extended at an opposite end of the stack E from the connections 204 and 214, in order to allow it to be connected to the line PL.

Figure 5:
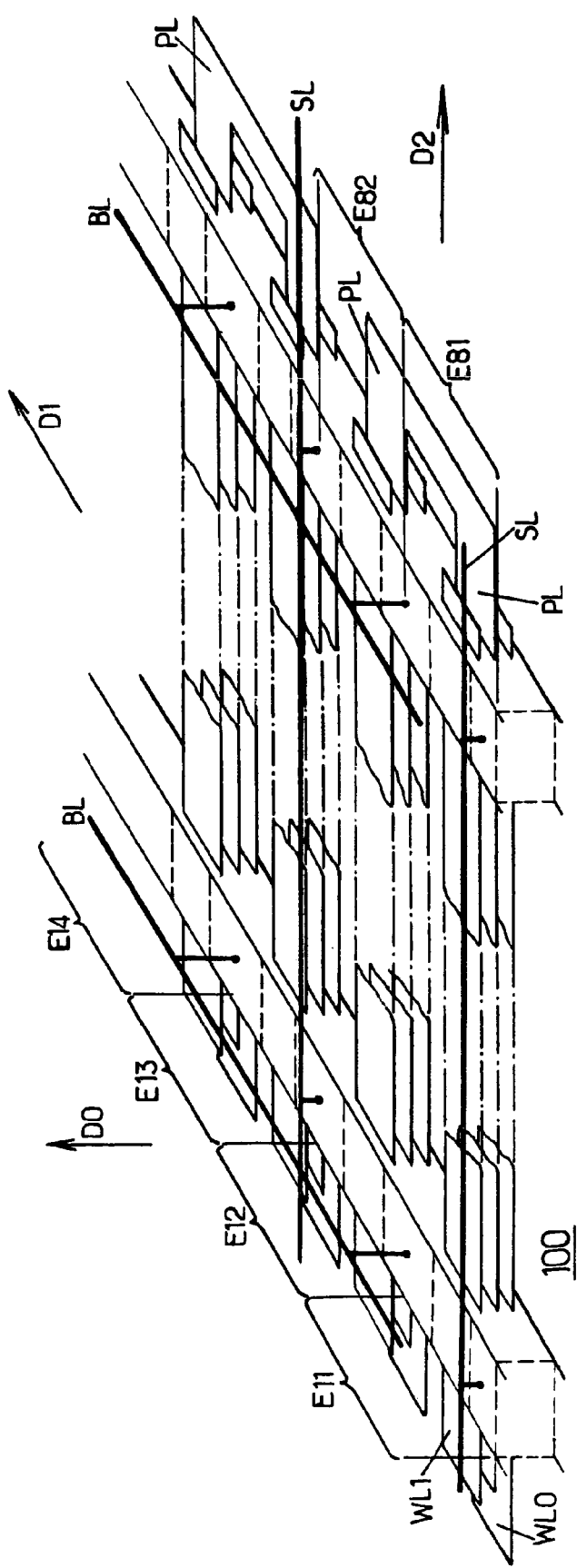
FIG. 5 shows an array of DRAM elements according to FIG. 1.

FIG. 5 shows a memory plane consisting of DRAM elements as described in relation to FIGS. 1 to 4. In this memory plane, the DRAM elements are placed in a particularly compact manner in order to increase the binary storage capacity per unit area of the substrate. They are furthermore electrically connected so as to allow binary sequences to be recorded. Such sequences may be bytes corresponding to separate storage addresses.

The DRAM elements are placed in an array arrangement on the surface of a substrate 100. The direction D0 of alignment of the polarization electrode 24 and of the intermediate portions 1 and 11 of the two transistors of each element is perpendicular to the surface of substrate 100.

The array arrangement comprises rows and columns of DRAM elements. The rows are parallel to the direction D2 and the columns are parallel to the direction D1. In FIG. 5, the DRAM elements E11, . . . , E81 form the first row and the elements E11, E12, . . . form the first column.

Each row possesses a first conducting region in which the gates 4 of the transistors of the first cells C0 of the DRAM elements of the row are formed. This first conducting region may be formed from continuous extensions of the gates 4 between two neighboring elements of the same row and is connected to a lower word line WL0.

Each row also possesses a second conducting region in which the gates 14 of the transistors of the second cells C1 of the DRAM elements of the row are formed. As in the case of the first conducting region, the second conducting region may be formed from continuous extensions of the gates 14 between two neighboring elements of the same row and is connected to an upper word line WL1.

Each row furthermore possesses a third conducting region in which the polarization electrodes 24 of the DRAM elements of the row are formed. This third conducting region may also be formed from continuous extensions of the electrodes 24 between two neighboring elements of the same row and is connected to a polarization line PL.

Each column has a doped region in which the source 102 and drain 103 regions and the intermediate portions 1, 11 of the cells C0 and C1 of the DRAM elements of the column are formed. The intermediate portions 1, 11 of the cells of two adjacent elements of the column are separated by a source 102 or drain 103 region common to said two elements.

The DRAM elements of the memory plane are furthermore connected in the following manner: the source regions 102 of the elements of each row are connected to a source line SL lying parallel to the row and the drain regions 103 of the elements of each column are connected to a bit line BL lying parallel to the column.

According to an improvement of the method of connecting the DRAM elements, the third conducting regions of two adjacent rows of DRAM elements having common drain regions 103 are connected together.

A row of DRAM elements may comprise, for example, 1024 elements, with the same number of associated bit lines BL so as to allow storage of two loops of 1024 bits in the cells C0 and C1 respectively, of the elements of this row. A bit line BL multiplexer is used to select, in a known manner, eight DRAM elements of this row. Two bytes stored in the cells C0 and C1, respectively, of the eight selected elements are thus obtained. The addressing of these two bytes is differentiated by the corresponding lines WL0 and WL1.

The memory plane thus obtained may be augmented by symmetrical or repeat operations in order to produce assemblies of DRAM elements arranged in the manner described above, these operations being carried out in the directions D1 and/or D2. An increased storage capacity is thus achieved.

The lithography steps carried out during the fabrication process described above impose a lower limit on all the dimensions parallel to the surface S of the substrate 100. A minimum dimension F is thus fixed by the lithography process used. The sides of the regions 102 and 103 that are parallel to the directions D1 and D2 may have this minimum dimension, as does the width, in the direction D1, of the stack E used for each element. The width of the stack E parallel to the direction D1 corresponds to the length of the channels 1c and 11c of the transistors of each element. Furthermore, each DRAM element of a given column is separated by an isolating column, which may be of the STI (Shallow Trench Isolation) type, from a DRAM element of a neighboring column. This isolating column may also have a width equal to the minimum dimension F. It is therefore apparent that the feature of the memory plane associated with a DRAM element corresponds to a projected area on the surface of the substrate equal to the sum of a projected area of region 102 or 103 equal to $F^2$, of a projected area of the stack E, also equal to $F^2$, and of a projected area associated with an isolating column length element, equal to $2 \times F^2$. Thus a total projected area of $4 \times F^2$ per DRAM element is obtained, i.e. $2 \times F^2$ per bit stored. This storage density per unit area of the substrate constitutes one of the advantages of the present invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated dynamic random access memory element comprising:
    first and second cells for the storage of two respective bits;
    a source region and a drain region having respective portions of semiconductor material of a same type of electrical conduction;
    each cell comprising: a field-effect transistor having a gate and an intermediate portion of semiconductor material, and furthermore having a source, a drain and a channel that are located in the source region, the drain region and the intermediate portion, respectively;
    the transistors for the first and second cells being placed in parallel between the source region and the drain region; and
    a polarization electrode placed between the respective intermediate portions of the two transistors, said polarization electrode being electrically isolated from each transistor and capacitively coupled to the intermediate portion of each transistor.

2. The element according to claim 1, wherein the gate of each transistor is placed on an opposite side from the intermediate portion of said transistor relative to the polarization electrode.

3. The element according to claim 2, wherein the intermediate portion of one of the two transistors, the polarization electrode and the intermediate portion of the other transistor are aligned in a direction of juxtaposition of the two transistors of said element.

4. The element according to claim 3, wherein the direction of juxtaposition is approximately perpendicular to a surface of a substrate bearing said element.

5. A memory plane comprising: a plurality of dynamic random access memory elements placed in an array arrangement, each dynamic random access memory element comprising:
    first and second cells for the storage of two respective bits;
    a source region and a drain region having respective portions of semiconductor material of a same type of electrical conduction;
    each cell comprising: a field-effect transistor having a gate and an intermediate portion of semiconductor material, and furthermore having a source, a drain and a channel that are located in the source region, the drain region and the intermediate portion, respectively;
    the transistors for the first and second cells being placed in parallel between the source region and the drain region; and
    a polarization electrode placed between the respective intermediate portions of the two transistors, said polarization electrode being electrically isolated from each transistor and capacitively coupled to the intermediate portion of each transistor.

6. The memory plane according to claim 5, placed on a surface of a substrate, wherein the polarization electrode of each element is placed between the respective intermediate portions of the transistors for the first and second cells in a direction perpendicular to the surface of the substrate.

7. The memory plane according to claim 6, wherein the array arrangement comprises rows of dynamic random access memory elements, each row having a first conducting region in which the gates of the transistors of the first cells of the elements of the row are formed, said first conducting region being connected to a lower word line, a second conducting region in which the gates of the transistors of the second cells of the elements of the row are formed, said second conducting region being connected to an upper word line, and a third conducting region in which the polarization electrodes of the elements of the row are formed, said third conducting region being connected to a polarization line.

8. The memory plane according to claim 7, wherein the array arrangement also comprises columns of dynamic random access memory elements, each column having a doped region in which the source and drain regions and the intermediate portions of the cells of the elements of the column are formed, the intermediate portions of the cells of two adjacent elements of the column being separated by a source or drain region common to the two said elements, the drain regions of the elements of the column being connected to a bit line lying parallel to the column, the source regions of the elements of each row being connected to a source line lying parallel to the row.

9. The memory plane according to claim 7, wherein the third conducting regions of two adjacent rows of elements having common drain regions are connected together.

10. An integrated circuit, comprising:
a first MOS transistor having a first source, first gate and first drain;
a second MOS transistor having a second source, second gate and second drain;
a polarization electrode positioned between the first gate and the second gate;
wherein a portion of the second MOS transistor overlies the polarization electrode and the polarization electrode overlies a portion of the first MOS transistor.

11. The integrated circuit of claim 10 wherein the portions of the first and second MOS transistors comprise regions containing their respective first and second gates.

12. The integrated circuit of claim 10 wherein the first MOS transistor includes a first intermediate portion containing a first channel and wherein the second MOS transistor includes a second intermediate portion containing a second channel and wherein the portions of the first and second MOS transistors comprise the first and second intermediate portions.

13. The integrated circuit of claim 12 wherein a part of the first and second intermediate portions opposite the first and second channels is positioned adjacent to the polarization electrode.

14. The integrated circuit of claim 10 wherein the first and second sources are electrically connected together and to a source line.

15. The integrated circuit of claim 14 wherein the source line is coupled to receive a reference voltage.

16. The integrated circuit of claim 10 wherein the first and second drains are electrically connected together and to a bit line.

17. The integrated circuit of claim 16 wherein the first gate is electrically connected to a first word line and the second gate is electrically connected to a second word line.

18. The integrated circuit of claim 17 wherein the polarization electrode is electrically connected to a polarization line.

19. The integrated circuit of claim 10 wherein the first MOS transistor includes a first intermediate portion containing a first channel and wherein the second MOS transistor includes a second intermediate portion containing a second channel and wherein the polarization electrode is capacitively coupled to the first and second intermediate portions.

20. The integrated circuit of claim 19 wherein the capacitive coupling between the polarization electrode and the first intermediate portion is used to store a first data bit in the integrated circuit and the capacitive coupling between the polarization electrode and the second intermediate portion is used to store a second data bit in the integrated circuit.

21. The integrated circuit of claim 20 wherein the first and second drains are connected to a bit line, the first gate is connected to a first word line and the second gate is connected to a second word line.

22. An integrated circuit, comprising:
an array of two-bit memory cells, each memory cell comprising:
a first MOS transistor having a first source, first gate, first channel region and first drain;
a second MOS transistor having a second source, second gate, second channel region and second drain;
a polarization electrode positioned between the first channel region and the second channel region, the polarization electrode being capacitively coupled to the first channel region to store a first bit and capacitively coupled to the second channel region to store a second bit;
wherein the second channel region of the second MOS transistor overlies the polarization electrode and the polarization electrode overlies the first channel region of the first MOS transistor.

23. The integrated circuit of claim 22 wherein the first and second drains of each two-bit cell are connected to a bit line in the array, the first gate is connected to a first word line in the array and the second gate is connected to a second word line in the array.

24. The integrated circuit of claim 23 wherein the first and second sources of each two bit cell are connected to a source line in the array.

25. The integrated circuit of claim 24 wherein the source line receives a reference voltage.

26. The integrated circuit of claim 22 wherein a non-channel portion of each of the first and second channel regions are positioned adjacent to the polarization electrode.

27. An integrated circuit, comprising:
a first MOS transistor having a first source, first gate and first drain;
a second MOS transistor having a second source, second gate and second drain;
a polarization electrode;
wherein the first MOS transistor and second MOS transistor are vertically stacked above a substrate with the polarization electrode positioned there between.

28. The integrated circuit of claim 27 wherein a portion of the second MOS transistor adjacent the second gate overlies the polarization electrode and the polarization electrode overlies a portion of the first MOS transistor adjacent the first gate.

29. The integrated circuit of claim 28 wherein the portions of the first and second MOS transistors comprise channel regions of those first and second MOS transistors.

30. The integrated circuit of claim 29 wherein the polarization electrode is capacitively coupled to the channel regions of the first and second MOS transistors to store first and second data bits, respectively.

31. The integrated circuit of claim 27 wherein the first MOS transistor, polarization electrode and second MOS transistor form a two-bit memory cell, and the integrated circuit further comprises a plurality of those two-bit memory cells arranged in an array to form a semiconductor memory chip.

32. The integrated circuit of claim 31 wherein the first and second drains of each two-bit memory cell are connected to a bit line in the array, wherein the first gate of each two-bit memory cell is connected to a first word line in the array and wherein the second gate of each two-bit memory cell is connected to a second word line in the array.

* * * * *

UNITED STATES PATENT AND TRADEMARK OFFICE
CERTIFICATE OF CORRECTION

PATENT NO. : 7,202,518 B2
APPLICATION NO. : 10/877755
DATED : April 10, 2007
INVENTOR(S) : François Jacquet et al.

Page 1 of 1

It is certified that error appears in the above-identified patent and that said Letters Patent is hereby corrected as shown below:

In the Claims:

At column 8, claim number 3, line 45, please replace the word [ofjuxtaposition] with the words -- of juxtaposition --.

Signed and Sealed this
Thirtieth Day of August, 2011

David J. Kappos
*Director of the United States Patent and Trademark Office*